United States Patent
Park et al.

(10) Patent No.: US 6,882,780 B2
(45) Date of Patent: Apr. 19, 2005

(54) WAVELENGTH TUNEABLE OPTICAL DEVICE

(75) Inventors: Christopher Anthony Park, Stowmarket (GB); Richard Mark Ash, Bury St Edmunds (GB); Andrew Thomas Harker, Ipswich (GB); Paul Marshall Charles, Ipswich (GB)

(73) Assignee: Agilent Technologies, Inc., Palo Alto, CA (US)

( * ) Notice: Subject to any disclaimer, the term of this patent is extended or adjusted under 35 U.S.C. 154(b) by 210 days.

(21) Appl. No.: 10/245,421

(22) Filed: Sep. 17, 2002

(65) Prior Publication Data
US 2003/0081641 A1 May 1, 2003

(30) Foreign Application Priority Data
Nov. 1, 2001 (EP) .............................................. 01309279

(51) Int. Cl.⁷ ................................................. G02B 6/26
(52) U.S. Cl. .......................................... 385/40; 359/315
(58) Field of Search .......................... 385/40, 4–9, 326, 385/30; 359/315, 342

(56) References Cited

U.S. PATENT DOCUMENTS

| | | | |
|---|---|---|---|
| 6,016,198 A | * | 1/2000 | Burns et al. ................. 356/477 |
| 6,101,300 A | | 8/2000 | Fan et al. ...................... 385/27 |
| 6,466,703 B1 | * | 10/2002 | Ionov ............................ 385/10 |
| 6,600,844 B1 | * | 7/2003 | Ionov .............................. 385/9 |
| 2002/0181914 A1 | * | 12/2002 | Jansen ......................... 385/130 |
| 2004/0052454 A1 | * | 3/2004 | Kim .............................. 385/28 |

FOREIGN PATENT DOCUMENTS

| | | |
|---|---|---|
| DE | 196 34 893 | 5/1997 |
| WO | WO 99/09440 | 2/1999 |

OTHER PUBLICATIONS

U.S. Appl. No. 60/287,196.*
Noirard, P., Examiner. European Search Report, Application No. EP 01 30 9279, dated Mar. 26, 2002.
International Search Report Application No. PCT/US98/16736 dated Jan. 25, 1999.
Johnck M., "Polyacrylate und Polylactone . . . " Jun. 27, 2000, XP002194242.
Durhuus T. et al., "All Optical Wavelength Conversion by SOA's In a Mach–Zehnder Configuration," IEEE Photonics Technology Letters, IEEE Inc., New York, US, vol. 6, No. 1 , 1994, pp. 53–33, XP000540019.

* cited by examiner

*Primary Examiner*—Diane I. Lee

(57) ABSTRACT

An optical device having a photonic band gap element operative such that the refractive index can be varied through application of an electrical signal. This enables the manufacture of tuneable lasers, optical add/drop multiplexers and tuneable optical wavelength converters.

7 Claims, 5 Drawing Sheets

WAVELENGTH TUNEABLE OPTICAL DEVICE

FIELD OF THE INVENTION

This invention relates to optical devices, the operation of which can be varied, with regard to the wavelength of light being generated or reflected, by the application of electrical control signals.

DISCUSSION OF THE BACKGROUND ART

As the requirement for greater data transmission capacity over an optical fibre increases, system designers are increasing the bit-rates of transmission systems and also using wavelength division multiplexing (WDM) arrangements so that a number of signals can be transmitted at different wavelengths in a single optical fibre. This requires that optical transmitters are available in each of the transmission wavelengths, both to build a transmission system and for stocking as spare parts. These activities would be simplified if tuneable optical transmitters were available, the output wavelength of which could be controlled simply by the application of a signal such as an electrical voltage. Known tuneable optical devices are difficult to manufacture and hence tend to be expensive.

SUMMARY OF THE INVENTION

According to a first aspect of the invention there is provided an optical device comprising a waveguide, a reflective element, and an electrical contact, the reflective element being coupled to the electrical contact such that, in use, the refractive index of the reflective element is varied in response to a signal applied to the electrical contact to control the wavelength of light propagating in the waveguide. Preferably, the reflective element comprises a photonic band gap material. The reflective element may comprise an halogenated lactone.

The optical device may be a semiconductor laser, in which the variation of the refractive index of the reflective element, in use, controls the output wavelength of the semiconductor laser. The reflective element may comprise a plurality of apertures extending into the semiconductor laser or alternatively a planar structure deposited on top of the semiconductor laser. The optical device may be an optical multiplexer in which the variation of the refractive index of the reflective element, in use, controls the wavelength to be multiplexed.

According to a second aspect of the invention there is provided an optical wavelength converter comprising a semiconductor laser as described above.

BRIEF DESCRIPTION OF THE DRAWINGS

The invention will now be described, by way of example only, with reference to the following Figures in which.

DETAILED DESCRIPTION OF THE PREFERRED EMBODIMENTS

Figure 1:
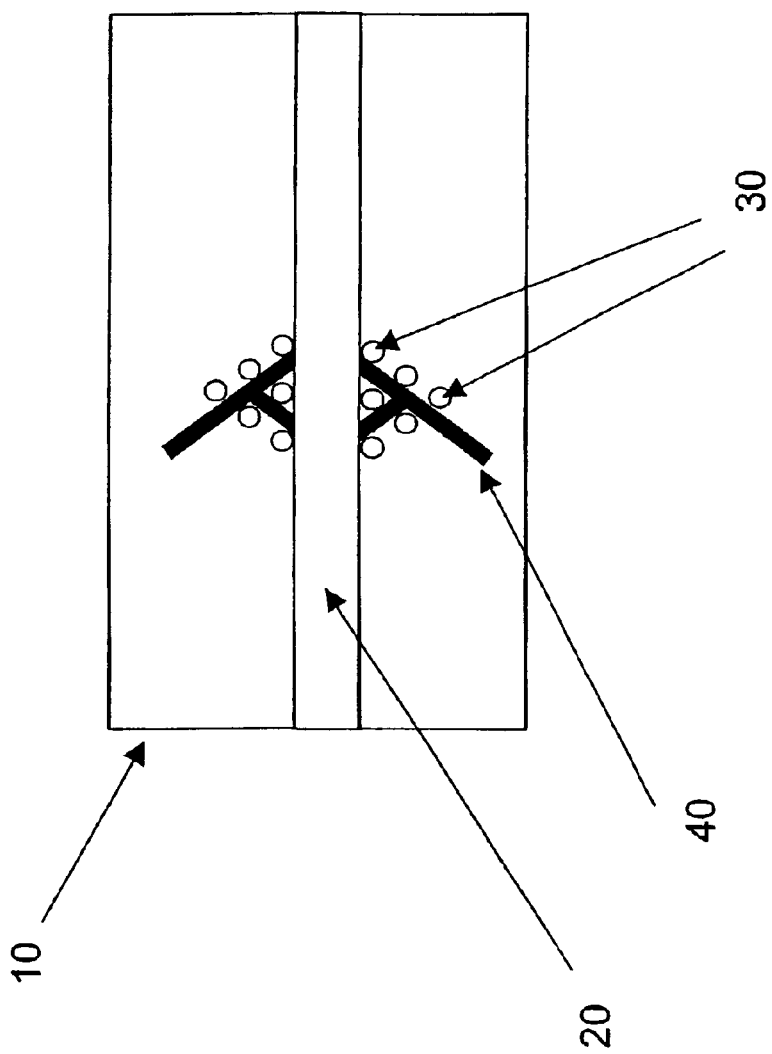
FIG. 1 shows a schematic depiction of a semiconductor laser device according to the present invention in a plan view.

FIG. 1 shows a schematic depiction of a semiconductor laser device according to the present invention in a plan view. The semiconductor laser device 10 comprises, amongst other features, a stripe region 20 into which electrical current is injected and within which light generated by the semiconductor laser is waveguided. An array of holes 30 are then defined within the uppermost surface of the semiconductor laser device, adjacent to the perimeter of the stripe region of the laser. The holes 30 need to have a diameter of a few hundred nanometres and examples of suitable techniques for forming holes of such a size are Reactive Ion Etching (RIE) and Focussed Ion Beam Etching (FIBE); clearly other techniques may be employed if they are capable of forming holes of such a size. The distribution of the holes depicted in Figure is provided by way of an example only; any distribution of holes could be used as long as there is a sufficient overlap between the holes and the optical filed within the laser device. Furthermore, the use of a stripe laser is purely exemplary and a ring laser, or other laser construction, could equally be used in the present invention.

The holes 30 are filled with an electro-optic material, that is a material whose refractive index can be controlled by varying an electrical voltage applied to the material. Examples of such an electro-optic material are halogenated lactones having a glass transition temperature of 200-300° C. or Redox materials. For examples of suitable materials see the dissertation "Polyacrylate und Polylactone für Anwendungen in einmodigen, integriert optischen, passiven Wellenleitern" M. Jöhnck, University of Dortmund.

The holes can be filled with the material in liquid form, or as a semi-solid where the design of the holes can prevent entrapment to ensure uniform filling. The holes are then connected together by electrical contact 40, which is in turn connected to an electrical bondpad (not shown). This electrical contact may be made, for example, by depositing indium tin oxide (ITO) onto the upper surface of the laser or alternatively by forming Cr/Au contacts by sputtering or evaporation and then connecting by a wire bond (or other low-resistance method). It is preferred that the lower electrical contact be made through the underside of the semiconductor device but other arrangements are conceivable, for example, if the semiconductor substrate were to be a semi-insulating material then the second electrical contact to the electro-optic material could be made on the uppermost surface of the semiconductor device.

This arrangement allows an electrical signal to be applied to the electro-optic material, the variation of which will change the refractive index of the electro-optic material. If the holes containing the electro-optical material are located sufficiently close to the stripe region of the semiconductor material then the variation in refractive index will interact with the light being waveguided in the stripe region of the laser.

Appropriate control of the refractive index of the electro-optic material can be used to tune the wavelength of the laser device, causing the electro-optic material to act as a reflective grating or photonic band gap device. A typical semiconductor material, for example indium phosphide, has a refractive index of 3.2 whilst a typical electro-optic polymer has a refractive index of approximately 2.0. It is possible to calculate the effect of varying the refractive index of the electro-optic material using the equation $$D = \frac{m \cdot \lambda_g}{2 \cdot n_{eff}}$$

where D is the pitch of the grating feature (that is, the separation of adjacent holes), m is the order of the grating (for which 3 has been shown to be a suitable choice), $\lambda_g$ is the reflection wavelength of the grating and $n_{eff}$ is the compound reflective index for the semiconductor material and the electro-optic material. If the pitch D is 800 μm and the hole size is 200 μm then $n_{eff}$ is 2.9 and the reflection wavelength is 1547 nm at the third order. If the refractive index of the electro-optic material is changed by, for example 0.1, then $n_{eff}$ becomes 2.88, giving a third order reflection wavelength of 1533 nm. Current electro-optic polymers are capable of achieving values of the electro-optic coefficient of 200 ppm/V which equates to a refractive index change of 0.005/V and thus a voltage of approximately 20V would be required to achieve the above tuning range. It is possible that future changes in electro-optic polymers could enable similar refractive index changes for a lower voltage.

Thus, it can be seen that the output of the laser can be tuned to a desired wavelength by the action of the photonic band gap element. This enables frequency agile laser transmitters, that are required to change their transmission wavelengths during operation, and greatly simplifies the manufacture of WDM systems and the stocking of spare parts as the wavelength of a laser can be chosen before it is used, rather than having to carry a large inventory consisting of one or more lasers for each of the wavelengths in use.

Figure 2:
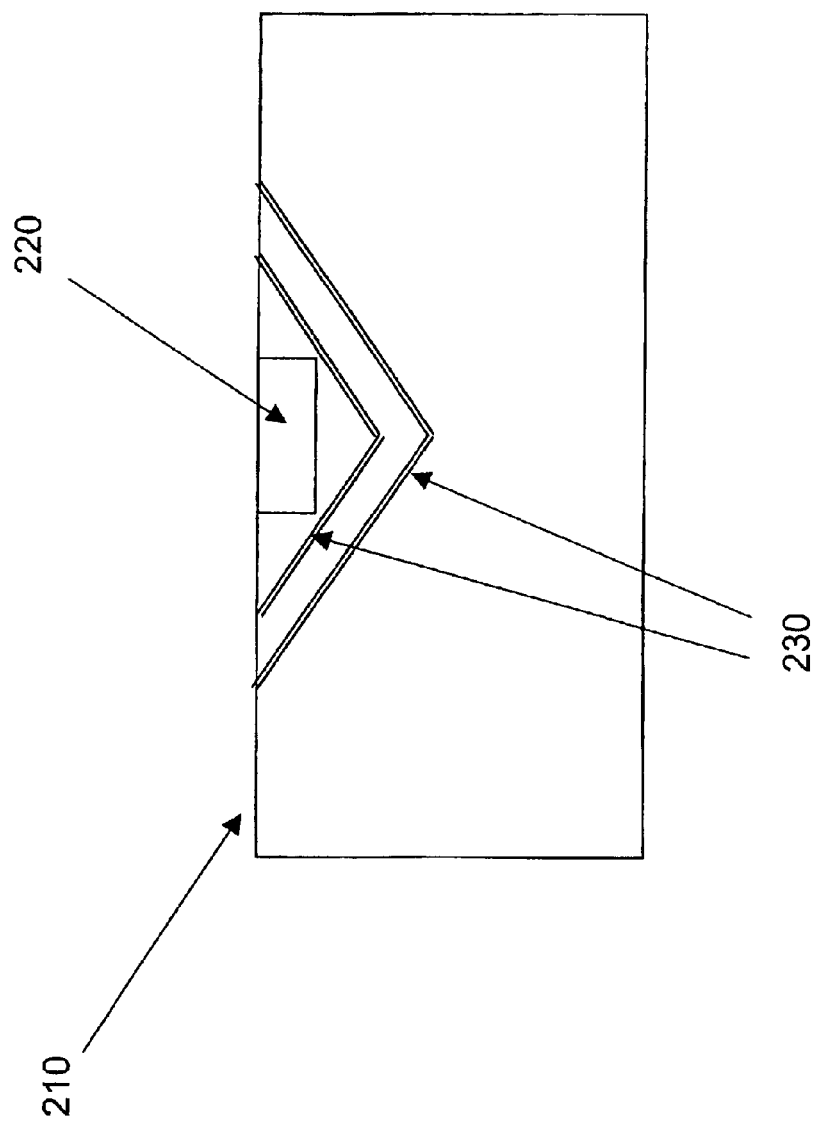
FIG. 2 shows a schematic depiction of a semiconductor laser device according to a second embodiment of the present invention in a cross-sectional view.

FIG. 2 shows a schematic depiction of a semiconductor laser device according to a second embodiment of the present invention in a cross-sectional view. Semiconductor laser device 210 comprises a stripe region 220 and a plurality of holes 230. In the structure described above and depicted in FIG. 1, the holes are oriented normal to the surface of the semiconductor material. In an alternative, as shown in FIG. 2, the holes are formed at an angle to the surface of the semiconductor material.

Preferably, the holes formed on each side of the stripe region 220 interconnect beneath the stripe region. When these interconnected holes are filled with an electro-optic material all of the optical polarisation states propagating within the stripe region will couple equally with the photonic band gap material and thus will reduce the polarisation sensitivity of the laser. A further advantage of interconnecting the angled holes is that it is easier to fill the holes using vacuum techniques to remove trapped air pockets: this is not possible with the blind holes shown in FIG. 1. Although FIG. 2 shows, from a cross-sectional perspective, the interconnected holes having a 'V'-shaped profile it will be readily understood that different geometries of holes may be used.

In use, the operation of laser 210 is as described above with reference to FIG. 1. The electrical voltage applied to the electro-optic material is varied in order to control the refractive index of the electro-optic material and thus the effect of the photonic band gap. This effect can be used to tune the output wavelength of the laser.

Figure 3:
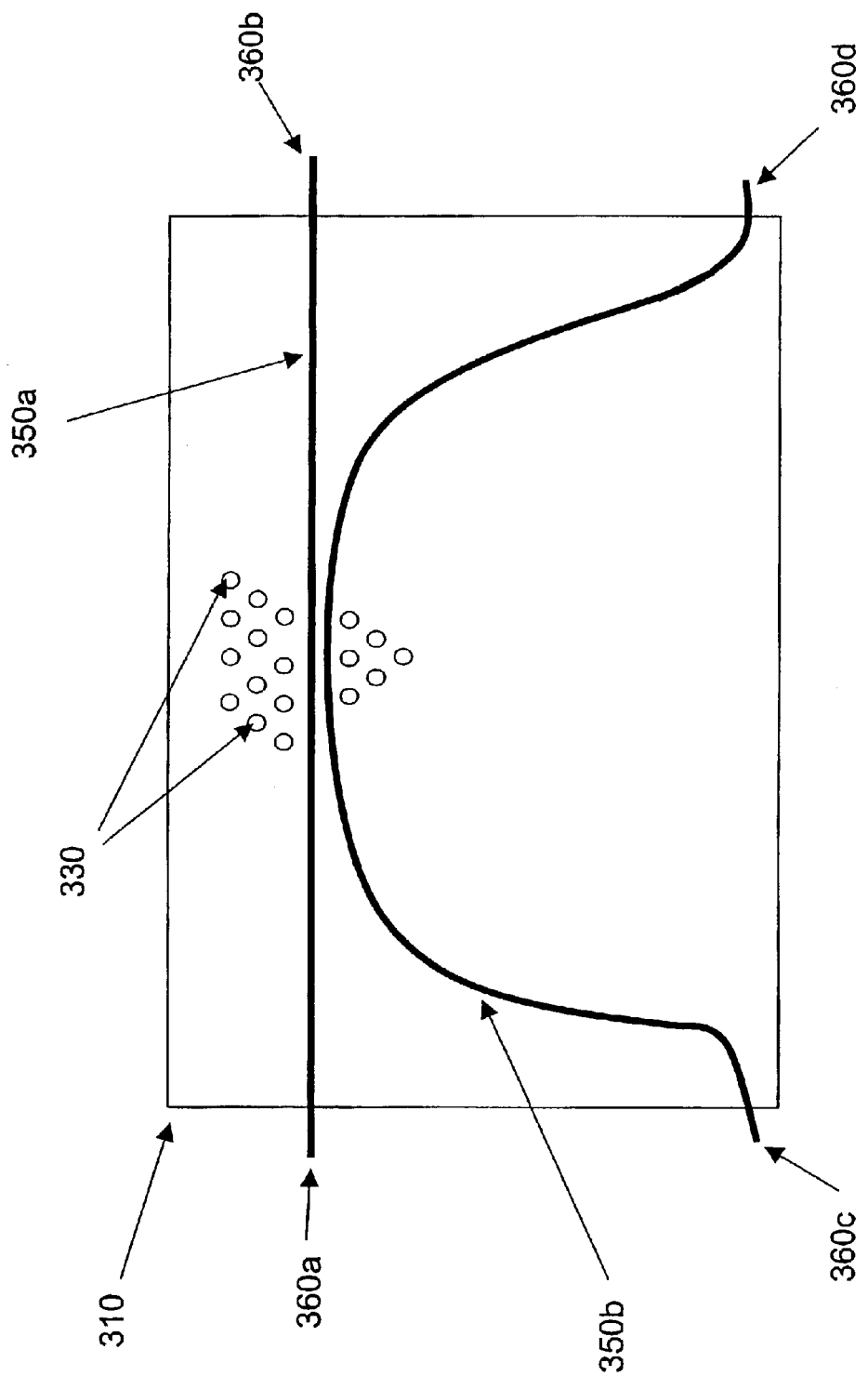
FIG. 3 shows a schematic depiction of an optical multiplexing device according to a third embodiment of the present invention in a plan view.

FIG. 3 shows a plan depiction of an optical multiplexing device according to a third embodiment of the present invention in a sectional view. Optical multiplexing device 310 comprises a plurality of holes 300, optical waveguide structures 350a, 350b and ports 360a, 360b, 360c, 360d.

The holes 330 have been filled with electro-optic material and connected to an electrode (not shown) in order that the refractive index of the electro-optic material can be controlled by the application of a suitable electrical voltage.

Optical Wavelength Division Multiplexed (WDM) signals are inserted into waveguide 350a at port 360a. If no voltage is applied to the electro-optic material contained in holes 330 then the WDM signals will not be interacted with and will exit waveguide 350a (and optical multiplexing device 310) at port 360b.

If a suitable electrical voltage is applied to the electro-optic material then one of the wavelength components of the WDM signal will be reflected by the electro-optic material into waveguide 350b, such that the wavelength component leaves the optical multiplexing device 310 at port 360c. Furthermore, it is possible to apply a further electrical voltage to the electro-optic material such that a wavelength component of a WDM signal can be inserted into waveguide 350b at port 360d and then reflected by the electro-optic material into waveguide 350a such that the newly added wavelength component leaves the optical multiplexing device, along with the other components of the WDM signal at port 360b. Thus, through appropriate control of the refractive index of the electro-optic material the optical multiplexing device is able to add, or drop, selected wavelength components to, or from a WDM signal The electro-optic material held in the holes 330 will need to be subdivided into different section, each of which having a respective electrode and electrical voltage source, in order to enable simultaneous adding and dropping of wavelengths and to enable the adding of a first wavelength and the dropping of a second wavelength (these acts may also be performed separately). It will be readily understood that the arrangement depicted in FIG. 3 could be extended to include additional waveguides and associated sections of electro-optic material. This would enable the optical multiplexing device to be able to add and/or drop one additional wavelength per additional waveguide.

Figure 4:
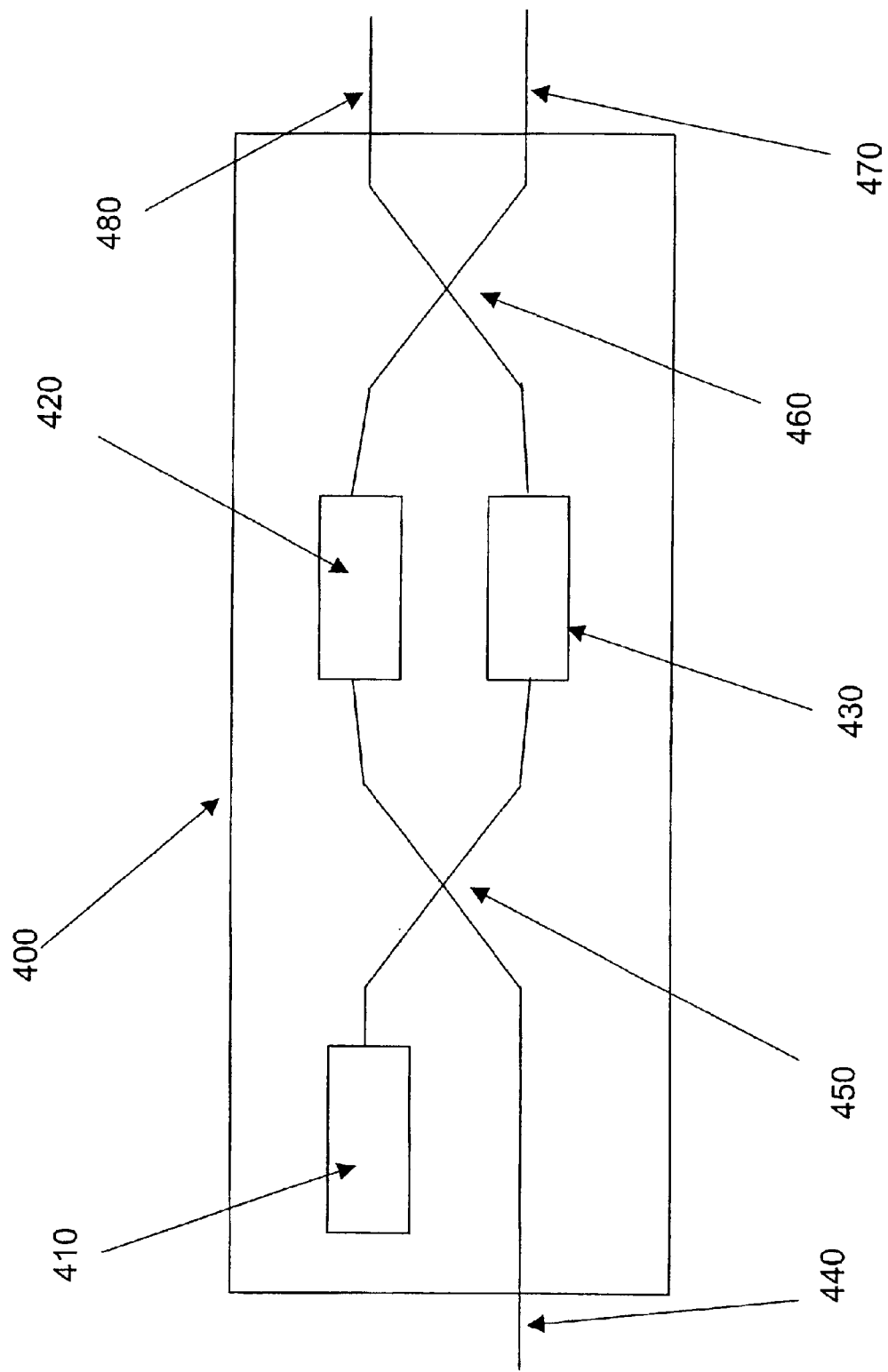
FIG. 4 shows a schematic depiction of an optical device comprising a semiconductor laser according to an embodiment of the present invention.

FIG. 4 shows a schematic depiction of an optical device comprising a semiconductor laser according to an embodiment of the present invention. Optical device 400, which may be integrated onto a single chip, comprises a semiconductor laser 410 according to the present invention, first and second semiconductor optical amplifiers 420, 430, input port 440, first and second optical couplers 450, 460, and first and second output ports 470, 480. The data input 440 and the output of the semiconductor laser are each connected to a respective input port of the first optical couplers 450. Each of the outputs of the optical coupler 450 is connected to the input of one of the semiconductor optical amplifiers (SOAs) 420, 430 such that the outputs of the semiconductor laser and the input port are present at the input of both of the SOAs (this is often referred to as a Mach-Zehnder configuration). The output of each SOA is connected to a respective input port of the second optical coupler such that the output signal from each SOA is present at each of the output ports 470, 480.

The optical device 400 is a wavelength converter. A data signal arrives at input port 440 at a first wavelength and the semiconductor laser 410 is tuned to a second wavelength to which the data signal is to be converted to. When the data signal and a continuous wave (cw) output from the semiconductor laser are fed into the SOAs, non-linear effects occur within the SOAs and cause a phenomenon known as cross gain modulation (or cross phase modulation) to take place. Cross gain modulation causes the data signal being carried at the first wavelength to be modulated onto the second wavelength being transmitted by semiconductor laser 410, such that the output 480 carries a data signal that has been converted from the first wavelength to the second wavelength.

Figure 5:
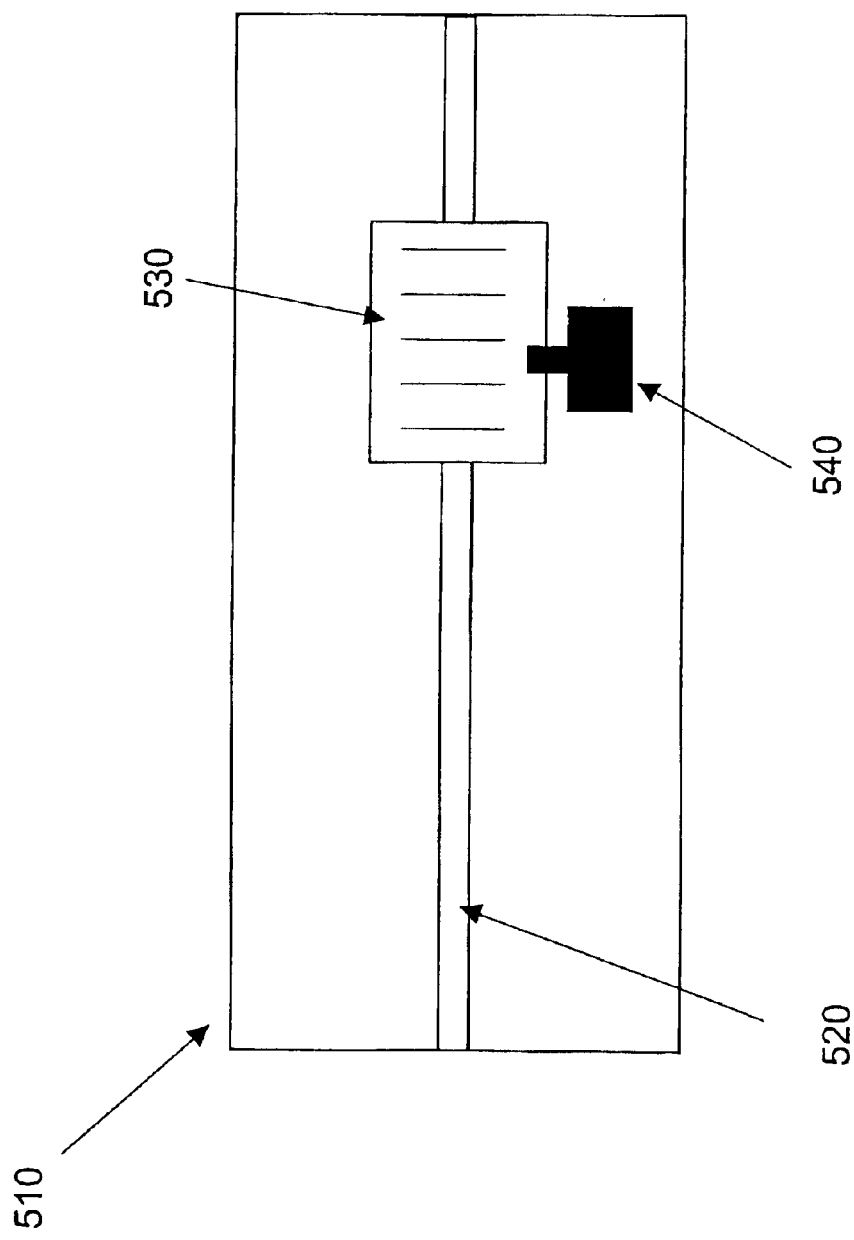
FIG. 5 shows a schematic depiction of a semiconductor laser device according to a fourth embodiment of the present invention

FIG. 5 shows a schematic depiction of a semiconductor laser device according to a fourth embodiment of the present invention. Semiconductor laser 510 comprises optical waveguide 520, grating 530 and electrical connection 540. Whereas the embodiments depicted in FIGS. 1 and 2 comprised an array of holes, filled with electro-optic material, that penetrated into the semiconductor material, semiconductor laser device 510 comprises a planar grating 530 that is formed over the waveguide 520. Typically the dimensions of such a grating would be a few tens of microns long and wide enough to cover the optical field in the horizontal direction, which would determined largely by the stripe width (or the size and geometry of a ring laser, or any other kind of laser. The grating is etched into the semiconductor material using known techniques and is then overlaid with electro-optic material using, for example, spin coating techniques. An electrical contact 540 is made to the electro-optic material, using, for example, the techniques described above so that the refractive index of the electro-optic material can be controlled through the application of a suitable electrical voltage.

Semiconductor laser 510 has the advantage of being easier to process than the semiconductor lasers described above with reference to FIGS. 1 and 2. However, it is believed that the overlap integral between the grating and the light propagating in the waveguide will be more difficult to reproduce and thus the control of the laser's tuneability may be less predictable and the laser performance might also be diminished.

What is claimed is:

1. An optical device comprising a waveguide, a reflective element, and an electrical contact, said reflective element being coupled to said electrical contact such that the refractive index of the reflective element is varied in response to a signal applied to the electrical contact to control the wavelength of light propagating in the waveguide, wherein said reflective element comprises a photonic band gap material, and wherein further said reflective element comprises an halogenated lactone.

2. An optical device according to claim 1, in which said optical device is semiconductor laser.

3. An optical device according to claim 2, in which the variation of the refractive index of the reflective element controls said output wavelength of said semiconductor laser.

4. An optical device according to claim 1, in which said optical device is an optical multiplexer.

5. An optical device according to claim 4, in which the variation of the refractive index of the reflective element, in use, controls the wavelength to be multiplexed.

6. An optical device comprising a waveguide, a reflective element, and an electrical contact, said reflective element being coupled to said electrical contact, such that the refractive index of said reflective element is varied in response to a signal applied to said electrical contact to control the wavelength of light propagating in said waveguide, wherein said reflective element comprises a plurality of apertures extending into said semiconductor laser.

7. An optical device comprising a waveguide, a reflective element, and an electrical contact, said reflective element being coupled to said electrical contact, such that the refractive index of said reflective element is varied in response to a signal applied to said electrical contact to control the wavelength of light propagating in said waveguide, wherein said reflective element comprises a planar structure deposited on top of said semiconductor laser.

* * * * *